United States Patent [19]

Wertheimer et al.

[11] Patent Number: 5,424,131
[45] Date of Patent: Jun. 13, 1995

[54] BARRIER COATINGS ON SPACECRAFT MATERIALS

[75] Inventors: Michael R. Wertheimer; Henry P. Schreiber, both of Quebec, Canada

[73] Assignee: Polyplasma, Inc., Montreal, Canada

[21] Appl. No.: 8,839

[22] Filed: Jan. 25, 1993

Related U.S. Application Data

[63] Continuation of Ser. No. 604,378, Oct. 29, 1990, abandoned, which is a continuation of Ser. No. 400,779, Aug. 30, 1989, abandoned, which is a continuation of Ser. No. 126,895, Nov. 30, 1987, abandoned.

[51] Int. Cl.$^6$ .................. B32B 27/38; B32B 9/04; B05D 3/06
[52] U.S. Cl. .................... 428/413; 427/489; 427/578; 427/579; 428/446; 428/447; 428/473.5; 428/480
[58] Field of Search .............. 427/578, 579, 574, 459; 428/446, 413, 447, 425.5, 473.5, 480

[56] References Cited

U.S. PATENT DOCUMENTS

| | | | |
|---|---|---|---|
| 4,430,361 | 2/1984 | Robinson et al. | 427/571 |
| 4,483,901 | 11/1984 | Okita et al. | 428/315.5 |
| 4,557,945 | 12/1985 | Yagi et al. | 427/575 |
| 4,560,577 | 12/1985 | Mirtich et al. | 427/38 |
| 4,599,678 | 7/1986 | Wertheimer et al. | 361/323 |
| 4,604,181 | 8/1986 | Mirtich et al. | 204/298 |
| 4,618,507 | 10/1986 | Sadhir | 427/124 |
| 4,649,071 | 3/1987 | Tajima et al. | 428/212 |
| 4,664,980 | 5/1987 | Sovey et al. | 427/397 |
| 4,687,679 | 8/1987 | Beale | 427/488 |
| 4,717,585 | 1/1988 | Ishihara et al. | 427/39 |
| 4,729,906 | 3/1988 | Kleeberg et al. | 427/490 |
| 4,737,379 | 4/1988 | Hudgens et al. | 427/39 |

OTHER PUBLICATIONS

Banks et al., "Low Earth Orbital Atomic Oxygen Simulation for Materials Durability Evaluation", on *Fourth International Conference on Spacecraft Materials in Space Environment*, Proceedings of a Symposium Held at CERT, Tlulouse, France, Sep. 6-9, 1988.

Banks et al., "Performance and Properties of Atomic Oxygen Protective Coatings for Polymeric Materials", *24th International SAMPE Technical Conference*, Oct. 20-22, 1992, pp. T165-173.

D. G. Zimcik and C. R. Maag, "Results of Apparent Atomic Oxygen Reactions with Spacecraft Materials during Shuttle Flight STS-41G", AIAA Shuttle Environment and Operations II Conference Houston, Tex., Nov. 1985, paper No. 85/7020.

K. G. Balmain and W. Hirt in IEEE Transactions on Electrical Insulation, vol. EI-18, pp. 498 to 503, 1983.

B. A. Banks et al. ("Ion Beam Sputter Deposited Thin Film Coatings for Protection of Spacecraft Polymers in Low Earth Orbit", 23rd AIAA Aerospace Science Meeting, Reno, Nev., Jan. 14-17, 1985).

*Primary Examiner*—Janyce Bell
*Attorney, Agent, or Firm*—Evenson, McKeown, Edwards & Lenahan

[57] ABSTRACT

A protective coating for the surfaces of organic polymers, to protect the surfaces against erosion by oxygen atoms, includes a thin protective barrier film on the surfaces. The film is deposited via a plasma, e.g., a low pressure glow charge, or other suitable methods. The material of the film can comprise plasma polymers, inorganic insulating films, or semiconducting or conductive materials.

25 Claims, No Drawings

BARRIER COATINGS ON SPACECRAFT MATERIALS

This application is a continuation of application Ser. No. 07/604,378, filed Oct. 29, 1990 now abandoned, which is a continuation of application Ser. No. 07/400,779, filed Aug. 30, 1989, now abandoned which is a continuation of application Ser. No. 07/126,895, filed Nov. 30, 1987 now abandoned.

BACKGROUND OF INVENTION

1. Field of the Invention

The invention relates to a process for coating the surface of an organic polymer to protect it against erosion by oxygen atoms. More specifically, the invention relates to such a process which includes the step of depositing a thin protective barrier film on the surface.

2. Description of Prior Art

All matter on the earth's surface, both living and inanimate, is protected by the atmosphere. This is not the case in outer space, where the atmosphere's density decreases rapidly with distance above the earth's surface; this decreases its ability to attenuate such harmful effects as, for example, energetic radiation (e.g. ultraviolet, UV). The insufficiency of life-sustaining molecular oxygen gas (due to the partial vacuum) and bombardment by short wavelength (high energy) electromagnetic radiation and by charged particles (electrons and ions) render any form of life impossible even a short distance (tens or hundreds of kilometers) above the earth's surface. The effects of charged particles are further enhanced in the so-called magnetosphere, some hundreds to thousands of kilometers above the earth's surface, where the earth's magnetic field traps and concentrates charged particles. The well-known van Allen radiation belts are related to this effect, as are such visible phenomena as the Aurora Borealis.

The present invention is primarily concerned with man-made objects (satellites) in earth orbit, and more specifically with those in "low earth orbit" (LEO), namely at altitudes of about 150 to 700 km. At these altitudes the major atmospheric constituent is atomic oxygen, O, which occurs as a result of UV-induced dissociation of molecular oxygen, $O_2$. Experience on shuttle flights has shown that even a short-term exposure to this environment can have harmful effects on spacecraft surfaces, particularly if these are composed of or covered with organic (polymeric) materials. Organic polymers are important to the design of present and future generations of spacecraft, as they are used in advanced composites for structural members, and for thermal protection in the form of films and coatings. For instance, at the altitude of the space shuttle (about 250 km), the atomic oxygen density ($\simeq 10^{-19}$ atoms cm$^{-3}$) is not very high, even though its concentration exceeds that of the next most abundant atmospheric constituent, molecular nitrogen, $N_2$. However, due to the high orbital velocity (about 8 km/sec) the O atom flux is quite high, about $10^{15}$ atoms/cm$^2$sec. Furthermore, this high velocity corresponds to collisions with highly energetic (about 5.0 eV) atomic projectiles. The observed result has been that exposed polymer surfaces are eroded by the chemically highly reactive O atoms, and that they suffer appreciable roughening and loss of mass. This, in turn, leads to irreversible degradation of the physical characteristics for which the surface or structural member were designed.

Erosion of organic materials by atomic oxygen in space has been described by various authors, for example by D. G. Zimcik and C. R. Maag, "Results of Apparent Atomic Oxygen Reactions with Spacecraft Materials during Shuttle Flight STS-41G", presented at AIAA "Shuttle Environment and Operations II Conference", Houston, Tex., November 1985, paper No. 85/7020.

Additional damage to insulating spacecraft materials such as organic polymers may result from charge buildup due to impinging electrons and ions. As described, for example, by K. G. Balmain and W. Hirt in IEEE Transactions on Electrical Insulation, Vol. EI-18, pages 498 to 503, 1983, charging by energetic electrons in space can lead to surface discharge arcs or flashover, which can permanently damage the polymer's structure and integrity. Furthermore, electrical transients associated with these discharge events can perturb or destroy electronic circuitry aboard the space vehicle.

Several authors have suggested remedies to the problems described above. For example, B. A. Banks et al. ("Ion Beam Sputter Deposited Thin Film Coatings for Protection of Spacecraft Polymers in Low Earth Orbit" presented at the 23rd AIAA Aerospace Science Meeting, Reno, Nev., Jan. 14–17, 1985) J. S. Sovey et al (U.S. Pat. No. 4,664,980) describe the use of ion beam sputter deposited thin coatings as oxidation barriers. Their coatings are composed of metal oxides (from the group of Si, Al, In, Sn) and up to 20 percent of a molecularly mixed flexible polymer (such as polytetrafluoroethylene), the purpose of the latter—according to the authors—being to provide the required flexibility. It was found, in both ground-based laboratory and in-space tests, that these thin protective coatings can act as barriers against oxidative erosion of the underlying polymer. Other authors have also shown thin layers of pure Teflon and sputtered or vapor deposited indium-tin oxide (ITO) to possess similar protective properties against attack by atomic oxygen.

SUMMARY OF INVENTION

Banks et al. (loc. cit.) have summarized the properties required for protective barrier coatings as follows:
- the barrier must, of course, itself be unaffected by atomic oxygen bombardment;
- it must be thin, light-weight and strongly adherent;
- it should be flexible, abrasion resistant, and allow adhesive bonding;
- it should be u.v. tolerant but not alter the substrate's optical properties;

Finally, an additional desirable property (not listed by Banks et al.) is that surface conductivity should be high in order to prevent the buildup of harmful potential gradients which result from charging.

It is an object of the present invention to provide protective coatings to organic polymer structures where said coatings have the above-named characteristics and are applied by glow discharge deposition.

DESCRIPTION OF PREFERRED EMBODIMENTS

Films and coatings may be prepared by a variety of physical and chemical deposition techniques as described, for example, by R. F. Bunshah et al. in "Deposition Technologies for Films and Coatings", Noyes Publications, Park Ridge, N.J., 1982. These include physical vapor deposition (PVD) by evaporation, sputtering, and ion plating; chemical vapor deposition (CVD), plasma enhanced (or-assisted) chemical vapor deposition (PECVD or PACVD), flame spraying or plasma spraying, deposition from aqueous solutions, and various other methods. Some of these methods are suitable for providing protective coatings on surfaces of organic polymers, the object of the present invention, particularly those which do not appreciably raise the surface temperature of the thermally sensitive polymer substrate. These include the above-mentioned PVD techniques, and methods involving low pressure plasma (also known as glow discharge). The latter category constitutes a particularly advantageous embodiment of the present invention.

The use of glow discharges for preparing thin solid films is well known (see, for example, J. Mort and F. Jansen "Plasma Deposited Thin Films", CRC Press, 1986): The workpiece (or pieces) to be coated is placed into a reactor chamber which can be evacuated with the help of a suitable vacuum pump. Following this, a flow of the chosen reagent gas (or gas mixture) is introduced, and the dynamic pressure in the chamber is adjusted to an appropriate value, typically in the range from 10 milli Torr to a few, e.g. 2, Torr (1 Torr=133 Pa). A glow discharge is then established in the chamber by applying electrical energy to the reagent gas flow, which results in chemical reaction leading to the desired thin film deposit. The electrical means, for example parallel plate electrodes, used to apply the said electrical energy is well known to those skilled in the art, and needs no further description here. Generally, high frequency electrical energy is preferred, typically in the audio-, radio-, or microwave frequency ranges, and this too is well known to those persons skilled in the art. In this manner, various types of thin film materials can be prepared, namely:

a) Plasma polymers,
b) inorganic insulating films,
c) semiconducting and conductive materials.

In category (a), films may be derived from halocarbon (e.g. fluorocarbon), hydrocarbon, or organosilicon "monomer" compounds such as hexamethyldisiloxane (HMDSO). Typical category (b) materials are inorganic silicon compounds such as "plasma silicon dioxide", P-$SiO_2$, plasma silicon nitride (P-SiN), or plasma silicon oxynitride (P-SiON). These may be prepared by reacting silane ($SiH_4$) with an appropriate second gas (or mixture) such as $N_2O$, $NH_3$, $N_2$, etc. Films in category (c) include amorphous, hydrogenated silicon (a-Si:H) and germanium, respectively prepared from $SiH_4$ and $GeH_4$ gas, metal films prepared from volatile organometallic compounds, and semiconducting metal oxide films such as tin oxide. The latter material may be prepared by co-reacting tetramethyltin [Sn $(CH_3)_4$] with oxygen in the glow discharge. Among the above-mentioned materials many can, in principle, provide suitable barriers against attack by O atoms, except those prepared from hydrocarbon reagents.

In the present work, a microwave plasma reactor of the type described by Weissfloch et al. in U.S. Pat. No. 3,814,983 was used to deposit various thin film materials onto organic polymers which are important to application in spacecraft, namely Kapton TM polyimide, polyethylene terephthalate (Mylar) TM, and Epoxy resin. An important advantage of this electrodeless reactor type is the ability to coat large objects, for example of cylindrical geometry, which is not readily feasible with conventional, (e.g. capacitively-coupled) radio-frequency discharge systems. In a second plasma reactor of the same type, a plasma in a flow of pure $O_2$ gas was used to generate O atoms. By exposing coated and control samples to this latter plasma, a laboratory simulation of LEO environment was achieved. The erosion rate of the various samples was determined gravimetrically by measuring weight loss with an electronic microbalance.

Typical examples of treatment results obtained using the method of the present invention are shown in Tables I to III.

TABLE I

Kapton Polyamide Substrate

| Sample No. | Sample description (coating type) | Coating conditions[a] | | | Thickness ($\mu$m) | Weight loss[b] (mg/cm$^2$ · h) |
|---|---|---|---|---|---|---|
| | | $T_s$(°C.) | $F_{SiH4}$ (sccm) | Gas/Flow (sccm) | | |
| 1 | control (untreated) | — | — | — | — | 4.60 |
| 2 | a-Si:H | 330 | 5 | Ar/30 | 0.5 | 0.05 |
| 3 | " | 250 | 5 | Ar/45 | 1.0 | 0.01 |
| 4 | P-SiN | 250 | 25 | $NH_3$/25 | 0.5 | 0.00 |
| 5 | P-$SiO_2$ | 25 | 25 | $N_2O$/25 | 0.5 | 0.10 |
| 6 | P-SiON | 25 | 25 | $NH_3$/25;$N_2O$/25 | 0.5 | 0.09 |
| 7 | PP HMDSO | 25 | — | HMDSO/45 | 0.5 | 0.28 |

[a]pressure: 100 m Torr; microwave power: 100 W
[b]$O_2$ flow: 200 sccm; pressure: 100 m Torr; microwave power: 300 W

TABLE II

Epoxy Resin Substrate

| Sample No. | Sample description (coating type) | Coating conditions[a] | | Thickness ($\mu$m) | Weight loss[b] (mg/cm$^2$ · h) |
|---|---|---|---|---|---|
| | | $F_{SiH4}$ (sccm) | Gas/Flow (sccm) | | |
| 8 | control (untreated) | — | — | — | 5.06 |
| 9 | a-Si:H | 10 | Ar/45 | 0.5 | 0.04 |
| 10 | P-SiN | 25 | $NH_3$/25 | 0.5 | 0.03 |
| 11 | P-SiON | 25 | $NH_3$24;$N_2O$/25 | 0.5 | 0.18 |
| 12 | P-$SiO_2$ | 25 | $N_2O$/25 | 0.5 | 0.09 |

[a]$T_s$ = 25° C.; other conditions as in Table I
[b]as in Table I

TABLE III

| | | Mylar Substrate | | |
|---|---|---|---|---|
| | | Coating conditions[a] | | |
| Sample No. | Sample description (coating type) | $F_{SiH_4}$ (sccm) | Gas/Flow (sccm) | Thickness (μm) | Weight loss[b] (mg/cm$^2$·h) |
|---|---|---|---|---|---|
| 13 | control (untreated) | — | — | — | 4.80 |
| 14 | a-Si:H | 10 | Ar/45 | 0.5 | 0.15 |
| 15 | P-SiN | 15 | NH$_3$/45 | 0.5 | 0.00 |
| 16 | P-SiON | 25 | NH$_3$/25;N$_2$O/25 | 0.5 | 0.03 |
| 17 | P-SiO$_2$ | 25 | N$_2$O/25 | 0.5 | 0.11 |

[a] as in Table II
[b] as in Tables I and II

For all three untreated substrate materials the weight loss is comparable, 4.8±0.2 mg/cm$^2$.h; all of the investigated coatings are seen to reduce the weight loss very substantially, in some instances (Nos. 4, 15) to an immeasurably small value. Thinner coatings (0.3 μm) have also been investigated and they yield comparable results. The coatings are flexible, strongly adherent and transparent, and therefore satisfy important requirements mentioned earlier. Regarding the last of these, electrical surface conductivity, the following additional tests have been conducted: Samples were exposed to corona discharge using a charging voltage of −4000 V; the decay rate of the surface potential was then measured using a noncontacting electrostatic voltmeter (Monroe Instruments Corp. "Isoprobe"). Some typical results of these tests are shown in Table IV:

TABLE IV

| | Decay rate of negative surface potential | | | | | |
|---|---|---|---|---|---|---|
| Sample | | Negative surface potential (in volts) at the indicated time | | | | |
| No. | Description | 0 s | 30 s | 5 min (*) | 2 h | 4 days |
|---|---|---|---|---|---|---|
| 1 | Kapton control | 2560 | 2560 | 2480 | 2080 | 820 |
| 8 | Epoxy control | 2500 | 2480 | 2400 | 1890 | 0 |
| 13 | Mylar control | 2460 | 2460 | 2440 | 2200 | 1700 |
| 2 | Kapton/a-Si:H | 1800 | 900 | 0 | — | — |
| 4 | Kapton/P-SiN | 2400 | 2340 | 1810 (380) | 990 | 0 |
| 5 | Kapton/P-SiO$_2$ | 400 | 220 | 70 | 0 | — |
| 6 | Kapton/P-SiON | 990 | 910 | 610 | 550 | 0 |
| 7 | Kapton/PP HMDSO | 2560 | 2560 | 2480 (330) | 2000 | 1250 |
| 9 | Epoxy/a-Si:H | 2000 | 1250 | 780 (120) | 90 | 0 |
| 16 | Mylar/P-SiON | 450 | 330 | 80 (60) | 0 | — |
| 17 | Mylar/P-SiO$_2$ | 750 | 720 | 510 | 0 | — |

(*) Following 20 minutes of exposure to O$_2$ plasma, and using same charging and charge decay measuring procedure.

Whereas the three control samples retain surface charge for lengthy periods (they become "electrets"), coated samples are seen to dissipate their surface charge quite rapidly. Not surprisingly, this decay is most rapid in the case of the semiconducting film a-Si:H, but even for the insulating materials such as P-SiO$_2$ and P-SiON it is far more rapid than for the untreated control samples. Surprisingly, the charge decay rate of coated samples is even more rapid, in practically all cases investigated, following exposure to oxygen plasma. For example, for samples Nos. 4, 7, 9, and 16 in Table IV, the surface potential had dropped to 380, 330, 120 and 0 volts, respectively, after 5 minutes following 20 minutes of O$_2$ plasma treatment and renewed corona charging. From this we infer that in space these coatings should be even more effective in preventing charge buildup than in the laboratory.

Although specific embodiments have been described, this was for the purpose of illustrating, but not limiting, the invention. Various modifications, which will come readily to the mind of one skilled in the art, are within the scope of the invention as defined in the appended claims.

We claim:

1. A method of protecting a body having a surface formed of organic polymer material from attack by atomic oxygen and from excessive electrical charge build up in an environment where the body is subject to attack by atomic oxygen and excessive electrical charge build up, said method comprising the steps of:

disposing said body in an evacuable reaction chamber and evacuating said chamber;

establishing a flow of reagent gas through said reaction chamber containing said body at a pressure in the range from about 10 milliTorr to about 2 Torr; said reagent gas being plasma reactable to form a plasma vapor deposited layer selected from the group consisting of amorphous hydrogenated silicon, plasma silicon dioxide, plasma silicon nitride, plasma silicon oxynitride and plasma polymerized hexamethyl disiloxane;

applying high frequency electrical energy selected from the group consisting of audio frequency electrical energy, radio frequency electrical energy and microwave frequency electrical energy to said reagent gas flow to establish a low pressure glow discharge plasma, and depositing a thin-film protective coating at least about 0.3 μm thick selected from the group consisting of amorphous hydrogenated silicon, plasma silicon dioxide, plasma silicon nitride, plasma silicon oxynitride and plasma polymerized hexamethyl disiloxane on said body at a temperature from about 25° to about 330° C. by low pressure plasma glow discharge chemical vapor deposition; and launching the coated body into said environment where the body is subject to an attack by atomic oxygen and excessive electrical charge build up.

2. A method according to claim 1, wherein said body comprises an organic polymer material selected from the group consisting of polyimide, polyethylene-terephthalate, and epoxy resin.

3. A method according to claim 1, wherein said body is a spacecraft body, and said environment is a low earth orbit space environment.

4. A method according to claim 1, wherein said reagent gas is silane, and said protective coating is an amorphous hydrogenated silicon coating.

5. A method according to claim 1, wherein said reagent gas is an admixture of silane and $N_2O$, and said protective coating is a plasma silicon dioxide coating.

6. A method according to claim 1, wherein said reagent gas is an admixture of silane and $NH_3$, and said protective coating is a plasma silicon nitride coating.

7. A method according to claim 1, wherein said reagent gas is hexamethyldisiloxane, and said protective coating is plasma polymerized hexamethyldisiloxane.

8. A method according to claim 1, wherein said reagent gas is an admixture of silane, $NH_3$ and $N_2O$, and said protective coating is a plasma silicon oxynitride coating.

9. A method according to claim 1, wherein said reagent gas further comprises an inert gas.

10. A method according to claim 1, wherein said protective coating is plasma silicon dioxide.

11. In combination, a spacecraft for use in outer space having an outer surface comprising an organic polymer material and a thin-film protective coating selected from the group consisting of amorphous hydrogenated silicon, plasma silicon dioxide, plasma silicon nitride, plasma silicon oxynitride and plasma polymerized hexamethyl disiloxane deposited on said outer surface of said spacecraft for protecting the spacecraft from attack by atomic oxygen and from excessive electrical charge build up, said thin film coating being deposited on said surface at a temperature from about 25° to about 330° C. by low pressure glow discharge plasma chemical vapor deposition effected by applying high frequency electrical energy selected from the group consisting of audio frequency electrical energy, radio frequency electrical energy and microwave frequency electrical energy to a reagent gas stream at a pressure from about 10 milliTorr to about 2 Torr said reagent gas being plasma reactable to form a plasma vapor deposited layer selected from the group consisting of amorphous hydrogenated silicon, plasma silicon dioxide, plasma silicon nitride, plasma silicon oxynitride and plasma polymerized hexamethyl disiloxane.

12. A combination according to claim 11, wherein said organic polymer material is selected from the group consisting of polyimide, polyethylene-terephthalate, and epoxy resin.

13. A combination according to claim 11, wherein said reagent gas is silane, and said protective coating is an amorphous hydrogenated silicon coating.

14. A method according to claim 11, wherein said reagent gas is an admixture of silane and $N_2O$, and said protective coating is a plasma silicon dioxide coating.

15. A method according to claim 11, wherein said reagent gas is an admixture of silane and $NH_3$, and said protective coating is a plasma silicon nitride coating.

16. A method according to claim 11, wherein said reagent gas is hexamethyldisiloxane, and said protective coating is plasma polymerized hexamethyldisiloxane.

17. A method according to claim 11, wherein said reagent gas is an admixture of silane, $NH_3$ and $N_2O$, and said protective coating is a plasma silicon oxynitride coating.

18. A spacecraft according to claim 11, wherein said protective coating is plasma silicon dioxide.

19. A method of protecting a body having a surface formed of organic polymer material from attack by atomic oxygen and from excessive electrical charge build up in an environment where the body is subject to attack by atomic oxygen and excessive electrical charge build up, said method comprising the steps of:

disposing said body in an evacuable reaction chamber and evacuating said chamber;

establishing a flow of reagent gas through said reaction chamber containing said body at a pressure in the range from about 10 milliTorr to about 2 Torr; said reagent gas being plasma reactable to form a plasma vapor deposited layer selected from the group consisting of amorphous hydrogenated silicon plasma silicon dioxide, plasma silicon nitride, plasma silicon oxynitride and plasma polymerized hexamethyl disiloxane;

applying high frequency electrical energy selected from the group consisting of audio frequency electrical energy, radio frequency electrical energy and microwave frequency electrical energy to said reagent gas flow to establish a low pressure glow discharge plasma, and plasma depositing an effective atomic oxygen protecting thickness of a protective coating selected from the group consisting of amorphous hydrogenated silicon, plasma silicon dioxide, plasma silicon nitride, plasma silicon oxynitride and plasma polymerized hexamethyl disiloxane on said body at a temperature from about 25° to about 330° C. by low pressure plasma glow discharge chemical vapor deposition; and launching the coated body into said environment where the body is subject to an attack by atomic oxygen and excessive electrical charge build up.

20. A method according to claim 19, wherein said reagent gas is silane, and said protective coating is an amorphous hydrogenated silicon coating.

21. A method according to claim 19, wherein said reagent gas is an admixture of silane and $N_2O$, and said protective coating is a plasma silicon dioxide coating.

22. A method according to claim 19, wherein said reagent gas is an admixture of silane and $NH_3$, and said protective coating is a plasma silicon nitride coating.

23. A method according to claim 19, wherein said reagent gas is hexamethyldisiloxane, and said protective coating is plasma polymerized hexamethyldisiloxane.

24. A method according to claim 19, wherein said reagent gas is an admixture of silane, $NH_3$ and $N_2O$, and said protective coating is a plasma silicon oxynitride coating.

25. A method according to claim 22, wherein said protective coating is plasma silicon dioxide.

* * * * *